United States Patent [19]

Atchley et al.

[11] 4,116,348

[45] Sep. 26, 1978

[54] COMPONENT LOCATING APPARATUS

[75] Inventors: Raymond D. Atchley, Los Angeles; John E. Barr, Brea; John B. Pegram, Los Angeles, all of Calif.

[73] Assignee: Deval Industries, Inc., Los Angeles, Calif.

[21] Appl. No.: 706,570

[22] Filed: Jul. 19, 1976

[51] Int. Cl.² ............................................. B65G 47/91
[52] U.S. Cl. ...................... 214/309; 29/740; 29/771; 206/329; 214/1 BT; 214/1 BV; 214/152; 221/211
[58] Field of Search .......................... 221/91, 246, 211; 214/1 R, 1 B, 1 BB, 1 BC, 1 BD, 1 BS, 1 BT, 1 BH, 1 BV, 1 CM, 8.5 D, 308, 309, 152; 294/64 R, 64 A, 64 B; 29/703, 705, 704, 771, 740; 220/345, 346; 206/328, 329, 267

[56] References Cited

U.S. PATENT DOCUMENTS

| | | | |
|---|---|---|---|
| 2,992,726 | 7/1961 | Simens | 220/345 X |
| 3,179,262 | 4/1965 | Carlson, Sr. et al. | 214/1 BT X |
| 3,263,858 | 8/1966 | Needham et al. | 221/246 X |
| 3,341,928 | 9/1967 | Naumann | 214/1 BT X |
| 3,479,716 | 11/1969 | Zanger, Jr. et al. | 221/216 X |
| 3,524,541 | 8/1970 | Nelson | 220/345 X |
| 3,915,312 | 10/1975 | Clark | 214/1 BT X |
| 4,009,785 | 3/1977 | Trayes | 214/1 BT |

FOREIGN PATENT DOCUMENTS

| | | | |
|---|---|---|---|
| 940,151 | 1/1974 | Canada | 214/309 |
| 484,113 | 8/1953 | Italy | 221/246 |

OTHER PUBLICATIONS

Western Electric Technical Digest #40, Oct. 1975, pp. 3 & 4; M. K. Avedissian (Author).

Primary Examiner—Frank E. Werner
Attorney, Agent, or Firm—George J. Netter

[57] ABSTRACT

A quantity of circuit chips are slidingly received in end to end relation in an elongated receptacle or "stick". The required number of such sticks are located in parallel groups at each side of a substrate mounted on an adjustable support. A pair of vacuum heads reciprocate along a path transversely of the substrate a fixed amount from a first extreme with the vacuum head located immediately over the endmost chip in a stick, to a second extreme which is a constant distance from the first position and lying over the substrate. The substrate is positioned to the proper x-y location such that when the transfer mechanism moves a chip to the position over the substrate, it will be properly located at the correct part of the substrate circuit. The sticks are indexable as needed to a position presenting the endmost chip of the selected stick underneath the outer extreme of the movement of the vacuum head. Control apparatus positions the substrate in any desired series of x-y locations.

9 Claims, 18 Drawing Figures

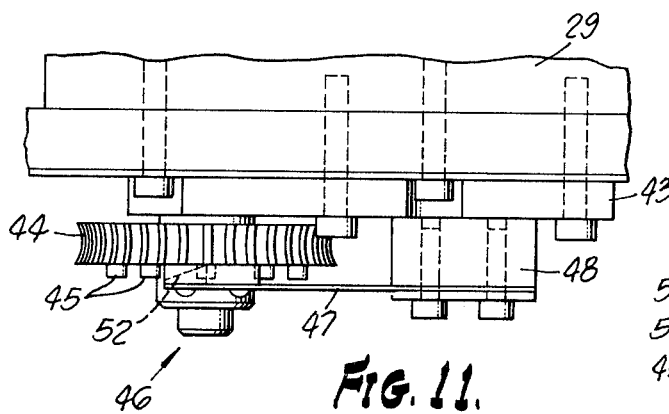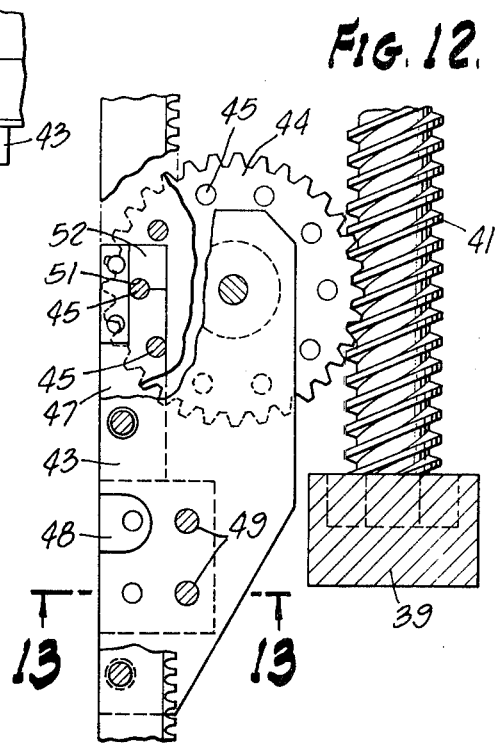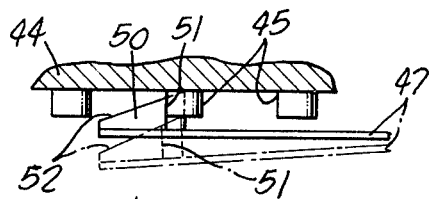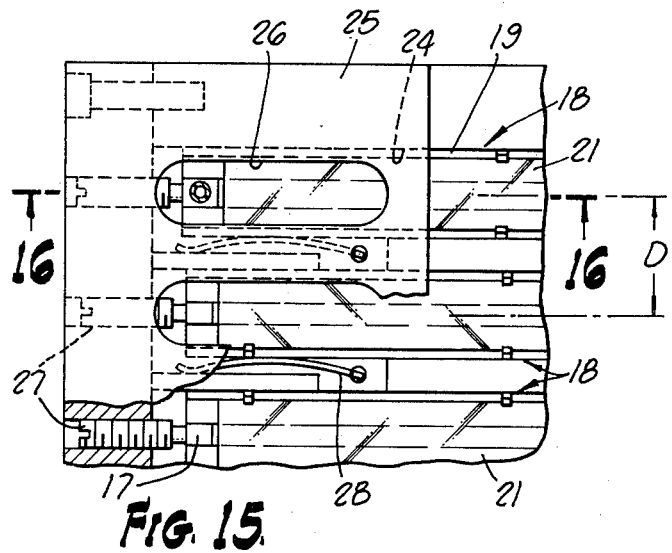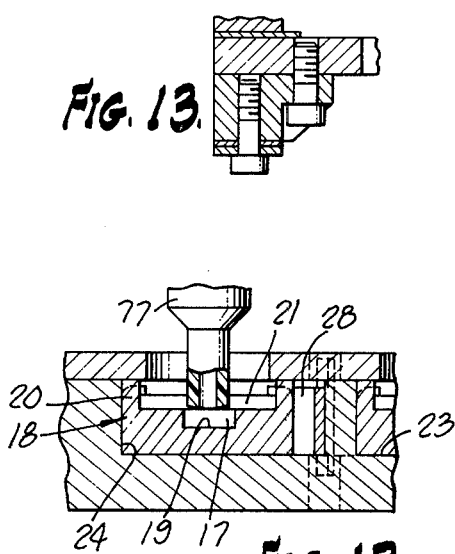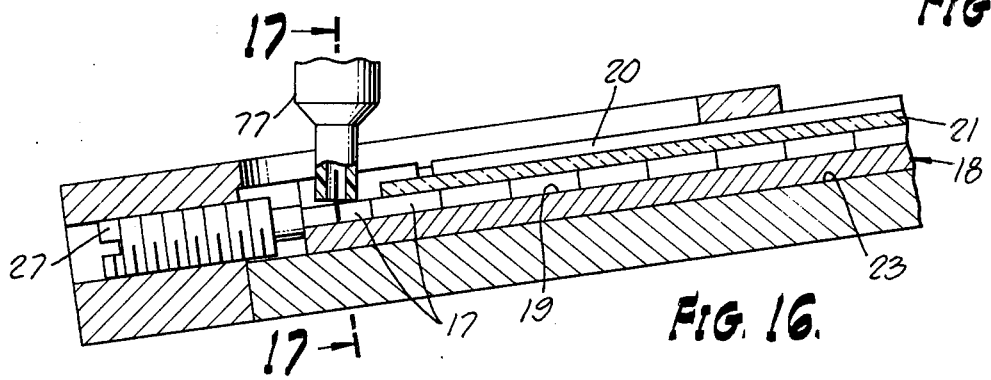

COMPONENT LOCATING APPARATUS

The present invention relates generally to a method and apparatus for positioning electrical and/or electronic items onto predetermined locations of a substrate, and, more particularly, to such a method and apparatus for positioning platelike electrical and/or electronic components or circuits ("chips") onto predetermined locations of and in prescribed orientation on a suitable substrate.

BACKGROUND OF THE INVENTION

In the construction of so-called hybrid circuits, discrete electrical and electronic components (e.g., transistors, capacitors), as well as integrated circuits in the form of small "chips", are mounted onto a substrate having suitable interconnection means. The interconnection means include deposited conductive paths laid out in a prescribed arrangement requiring precise location of the various components and integrated circuits to insure proper circuital connection. In the past, assembly of hybrid circuits has been a difficult and time consuming operation, requiring a high degree of dexterity and patience on the part of the assembler, primarily because of the small size of the chips (e.g., 0.050 of an inch square) and the necessity or orienting them properly on the circuit substrate.

OBJECTS AND SUMMARY OF THE INVENTION

A primary aim and object of the present invention is to provide a method and apparatus for precisely locating and orienting a circuit or component chips onto a substrate surface at predetermined x-y positions. A quantity of chips of the same kind (e.g., all resistors) are slidingly received in end to end relation in an elongated receptacle referred to generally as a "stick". The required number of such sticks are located in parallel groups at each side of the substrate which is mounted on a support precisely adjustable in the x and y directions. A pair of vacuum heads are located on a swivelable feed and transfer mechanism which moves along a path transversely of the supported substrate a predetermined fixed amount from a first extreme at which the vacuum head is located immediately over the endmost chip in a given stick, to a second extreme which is a constant distance from the first position and lying generally over the substrate. The substrate is positioned to the proper x-y location such that when the transfer mechanism moves a chip to the position over the substrate, the chip will be properly located at the correct part of the substrate circuit. Supporting means carrying the chip sticks are indexable upon need to a position presenting the endmost chip of the selected stick underneath the outer extreme of the movement of the vacuum head. Electrical and electronic control apparatus are also provided which are selectively adjustable to operate an indexing means for positioning the substrate in any desired predetermined series of x-y locations.

As an additional feature of the invention, a plurality of identical substrates may be located on the common x-y adjustable support and loaded with components and integrated circuit chips as required and at the proper locations on each.

DESCRIPTION OF THE DRAWING

FIG. 2 is a plan view of the loading apparatus of FIG. 1, shown with the covers removed.

FIG. 11 is a sectional, elevational, view of the magazine indexing apparatus taken along the line 11—11 of FIG. 10.

FIG. 12 is a plan sectional view taken along the line 12—12 of FIG. 10, showing the worm indexing drive for the component magazine.

FIG. 13 is a sectional view taken along the line 13—13 of FIG. 12.

FIG. 14 is an enlarged sectional, elevational, partially fragmentary view of the positioning levers for the indexing drive.

FIG. 15 is a plan, partially fragmentary view of several of the component sticks shown in the magazine.

FIG. 16 is a sectional view transversely of a component stick taken along the line 16—16 of FIG. 15.

FIG. 17 is an end elevational, sectional view taken along the line 17—17 of FIG. 16.

FIG. 18 is a side elevational, partially schematic view of apparatus for detecting the lack of pressure of a component in loading position.

DESCRIPTION OF A PREFERRED EMBODIMENT

Figures 1, 3:
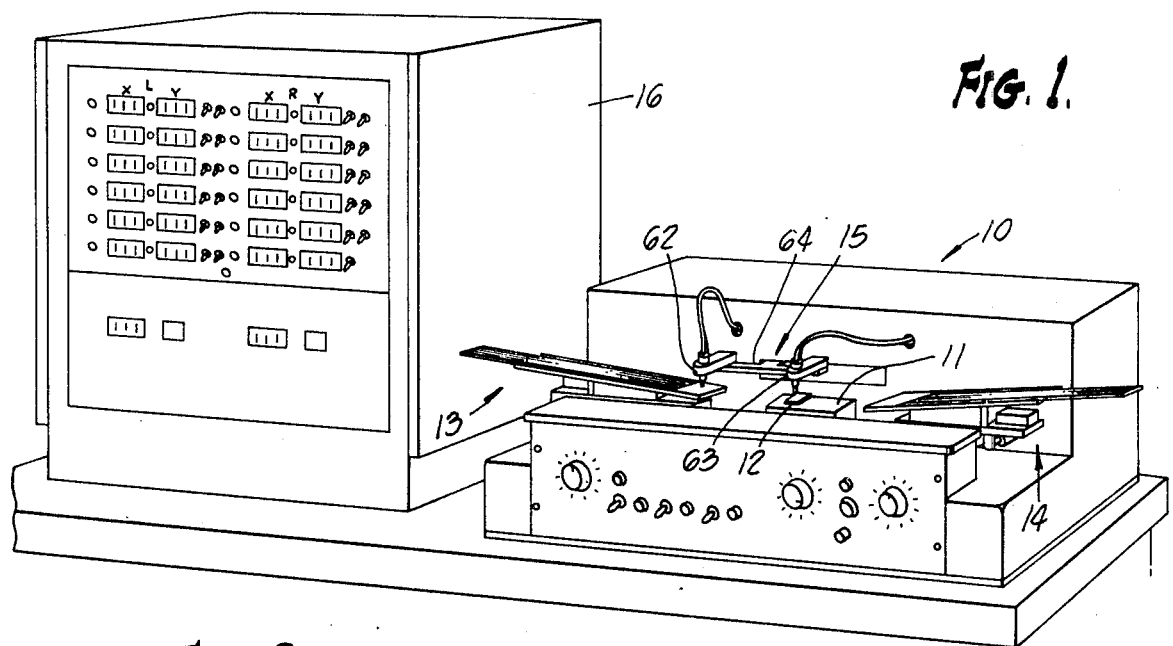
FIG. 1 is a perspective view of the chip loading apparatus of this invention and electrical control equipment associated therewith.
FIG. 3 is an enlarged plan, partially fragmentary, view of the loading table portion of the apparatus of FIG. 1.

With reference now to the drawing and particularly to FIG. 1, the apparatus of this invention shown enumerated generally as at 10, is seen to include a table 11 which is adjustably positionable in both the x and y directions and on which a circuit substrate 12 is fixedly held by vacuum means (not shown). A pair of component magazines 13 and 14 are respectively located at each side of the table 11, and a component transfer mechanism 15, in a way to be described, moves components from the magazines 13 and 14 onto predetermined locations of the circuit substrate 12. Electrical control apparatus 16 provides for setting the apparatus 10 to accomplish transfer of a plurality of different kinds of components onto precise, predetermined x and y locations on the circuit substrate 12.

The term "component" as used herein can be either a discrete electrical or electronic element (e.g., capacitor, resistor or transistor), or it can be a so-called integrated circuit. In the preferred form, these components are of a construction that is sometimes referred to as a "chip", which is of a square or rectangular geometry and has a relatively thin cross-section, giving the component an overall wafer shaped appearance. In the usual construction, the chips or wafers have conductive coatings applied to select edges, or in some cases at select areas on the major component surfaces, requiring proper component orientation before mounting onto a circuit substrate. That is, particularly in a three-terminal device such as a transistor, where the component is square or rectangular, care must be used to insure that it is properly oriented when placed down onto the circuit substrate to establish proper connection. As will be more particularly described, this invention provides special means located in the magazines 13 and 14, for initially holding a plurality of components in proper orientation during loading therefrom onto the substrate.

With simultaneous reference now to FIGS. 2, 9, 16 and 17, it is seen that a plurality of identically shaped components 17 are arranged in end-to-end relationship in special elongated holders or trays 18, which will be sometimes referred to herein as "sticks". More particularly, each stick has an elongated rectangular body with a continuous open slot 19 extending along one side thereof of such dimensions as to permit receipt therein of a quantity of components 17 in an end-to-end relationship and to maintain the components in this arrangement. In cross-section (FIG. 17), the elongated trays are seen to include upstanding side walls 20, between which is secured a sheetlike member 21 which covers the components carried within the slot 19. At the feed end of the tray, as can best be seen in FIGS. 16 and 17, the side walls 20 and cover 21 are removed for a sufficient distance from the feed terminus of the tray to fully expose at least one complete component located at the end of the slot 19.

Each tray or stick 18 is loaded with the same type of component, with the components arranged in end-to-end relationship in the associated open slot 19. The so-loaded stick can be stored in any convenient place until it is needed. To prevent components from being inadvertently removed at the stick ends prior to use in the described apparatus, a piece of tape or restraining clip may be placed over each end.

The trays or sticks 18, in addition to serving a primary function of maintaining a supply of components in proper orientation for loading onto the substrate, also prevent possible damage to the chips during storage and during the loading operation. Inventory control is made substantially easier with each stick including a predetermined large number of a given component.

A circuit substrate 12 for building by the described apparatus may be made in any of a number of standard ways, and the actual substrate construction does not, other than very generally, relate to the subject invention. In particular and in the more usual construction, such a substrate consists of an insulated base on a major surface of which a plurality of conductive paths are provided such as by a photo-etch or silk screen process, for example, thereby forming an interconnection circuit of prescribed character. The interconnection paths are arranged on the same generally flat surface, and in a manner to be described herein, the various components are then placed at the appropriate locations to be interconnected in accordance with the prescribed circuit.

Figure 9:
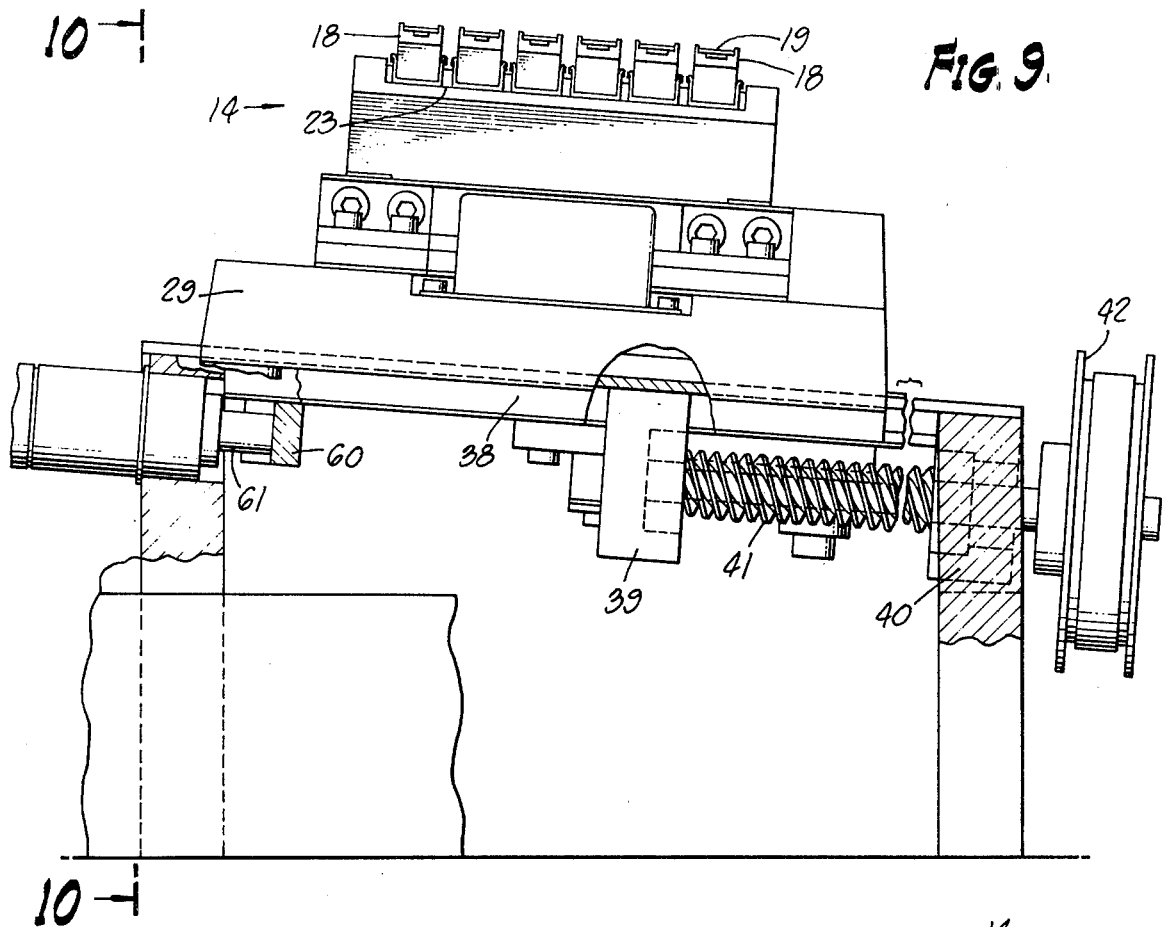
FIG. 9 is a side elevational, partially sectional, view of the component supply magazine and supporting table, taken along the line 9—9 of FIG. 2.
Figure 10:
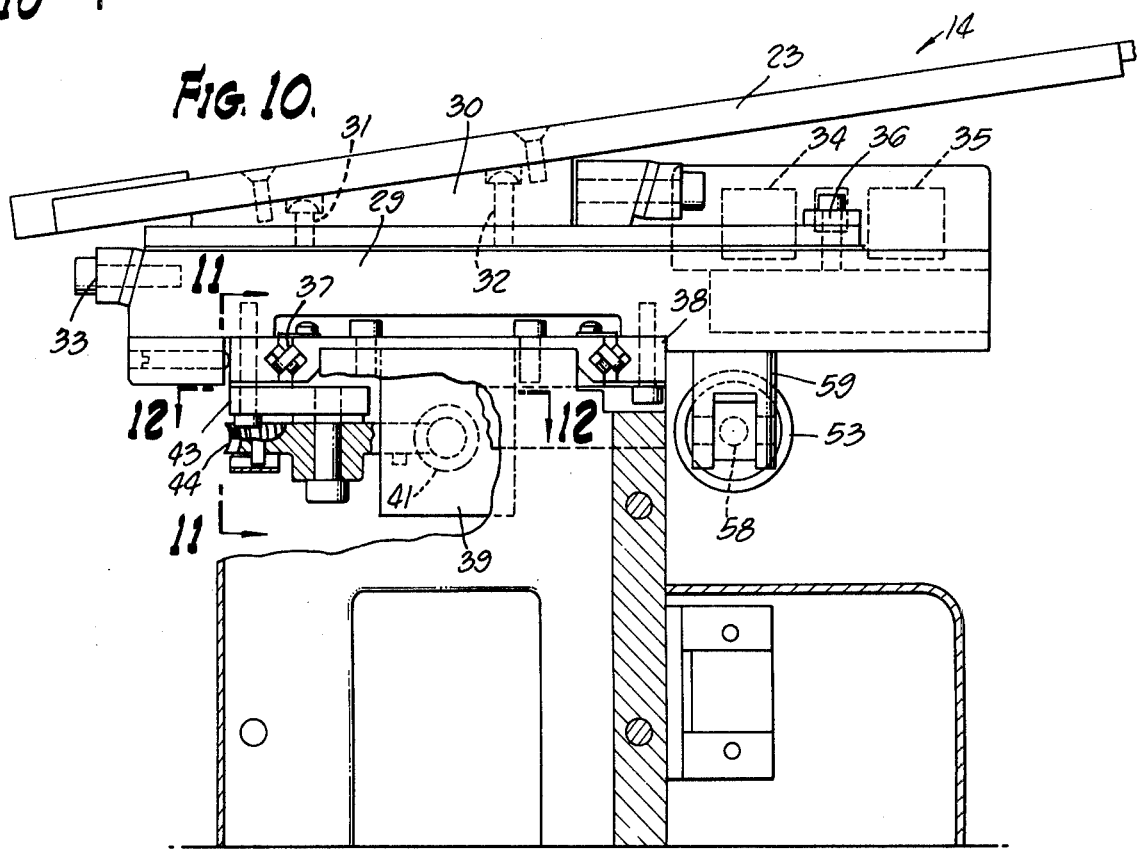
FIG. 10 is a front, sectional, view taken along the line 10—10 of FIG. 9.

The magazine 14, as seen best in FIGS. 2, 9 and 10, includes a relatively flat, sheetlike mounting surface 23, having a plurality of parallel slots 24 of such dimensions as to enable close fitting receipt of a stick 18 in each. A locating head 25 (FIG. 2) is received over one end of the mounting surface 23 and includes a plurality of elongated slotlike openings 26 which individually align with a slot 24 in the surface 23. Also aligned with the elongated slots and threadedly affixed to head 25 body wall are positioning screws 27 adjustable in a direction longitudinally of the slots 26 for engaging the end of the respective tray or stick 18 to precisely locate it for feeding of components therefrom. Leaf springs 28 (FIG. 15) within the inner cavity of the locating head engage the trays 18, accurately positioning them in slots 24 and also for resiliently securing them against inadvertent mislocation during use, for example.

With reference now particularly to FIG. 10, the mounting surface 23 is affixed to a movable support or table 29 for indexing movement in a manner to be described in a direction substantially 90° to the longitudinal axis of the slots 24. As will be shown, the purpose of this movement is to locate any desired one of the component feed or dispensing ends of the trays in the magazine in proper position for transferring a component contained therein to the substrate. That is, when building up a circuit substrate in the usual situation, the components are transferred in a fixed predetermined sequence. However, in certain circumstances components of the same kind may be required at a number of different locations and this will require selection of the proper component stick, moving it into the position for loading, followed by choice of another stick, moving it into locading position, and so forth.

With respect to the constructional details, reference is made now to FIG. 10. The table 29 is a generally flat rectangular body and affixed to its upper surface is a triangular spacer 30 which maintains the surface 23 at an angle with respect to the horizontal. That is, the surface 23 is maintained at all times with the trays 18 having their respective unloading ends held lower than their opposite ends so that gravity will produce automatic movement of the components along the tray slots toward the unloading end. Threaded members 31 and 32 secure the surface 23 to the spacer 30 and the spacer to the table 29, respectively. The spacer 30 is resiliently interconnected as at 33 with the table 29 to transmit vibrations to 23 and the sticks carried thereby, which vibrations are generated by the action of a pair of oppositely arranged coils 34 and 35 on an armature 36.

The coils are excited by alternating current which causes surface 23 to vibrate on the resilient suspension 33. Since the average force exerted on the armature 36 is the same, the zero position of the surface 23 remains constant regardless of the magnitude of vibration produced by the coils.

With reference now to both FIGS. 9 and 10, the table 29 and the surface 23 carried thereby is mounted on the upper end of a fixedly located pedestal 38 through the intermediary of rollers 37, such that the table 29 can be readily moved relative to the pedestal. As best seen in FIG. 9, the pedestal 38 includes a pair of spaced apart journals 39 and 40 for receiving the respective end portions of a worm drive screw 41, which drive screw extends in a direction parallel to the path of movement of the table 29 with respect to the pedestal 38. An outer end of the screw 41 is affixed to a pulley 42 via which it is rotatively driven in a manner to be described.

On the lower surface of the table 29 (FIG. 12), there is secured a plate 43 extending under a portion of the pedestal toward the drive screw 41. A worm gear wheel 44 rotatably mounted to the bottom of plate 43 meshes with the worm drive screw. The lower surface of the gear wheel 44 includes a plurality of cylindrical studs 45 extending outwardly therefrom and in equally spaced circumferential arrangement. The studs 45 are so mutually arranged that a linear movement of table 29 is produced between two immediately adjacent studs that is an integral multiple of the distance D between sticks (FIG. 15). As can be seen best in FIGS. 11 and 14, the indexing drive means 46 for the table includes a leaf spring arm 47 having one end portion affixed to the lower surface of a spacer block 48, which, in turn, is secured to the table 29 by threaded members 49. The other end of the leaf spring arm has a detent 50 with a first surface 51 vertically extending from the arm and a further forwardly tapered surface 52.

With simultaneous reference now to FIGS. 2, 11 and 14, the air cylinder 53 exerts a force on the table 29, causing the gear 44 to rotate and bring one of the studs 45 into engagement with the detent vertical surface 51. The worm 41 is prevented from rotating by virtue of its connection with the pulley 42 and the system is stationary until the pulley is driven.

As can be seen most readily in FIG. 2, the drive pulley 42 for each of the magazines 13 and 14 is interconnected to a common drive shaft 54 through a toothed belt 55 and corresponding pulley 56 on the shaft. More particularly, the belts 55 are toothed so that each revolution of the shaft 54 is precisely transmitted to the pulleys 42 and thus to the driving worm screw 41 for advancing the magazine as will be described. Each full rotation of shaft 54 produces one revolution of worm screw 41, which, in turn, causes the table 29 to advance the distance D, or the space between adjacent sticks.

Still referring to FIG. 2, the means for returning a magazine 13 or 14 to its rearmost position after indexing as described in the immediately preceding paragraphs, is enumerated generally as at 57. Specifically, this means includes a pneumatic drive 53 having a shaft 58 extending therefrom, the outer end of which is affixed to the lower surface of table 29 as at 59. In operation, admission of compressed air into one of the pneumatic drive 53 ports causes the shaft 58 to retract, drawing the table 29 and associated equipment mounted thereon to its uppermost position. The wheel 44 and drive screw 41, although meshed together, do not produce a driving reaction on the table 29 during the return movement, since the detent tapered surface 52 merely slides over the outer ends of the studs 45.

The upwardly directed movement of 29 is limited by the engagement of stop 60 and snubber 61 (FIG. 9), which is at a point where a stud 45 has just passed the detent surface 51. If at this time air should be added via another port to the cylinder 53, causing it to reverse, stud 45 is held by detent surface 51. By this action the table 29 and sticks carried thereby have been moved a distance equal to an integral multiple of distance D which is the desired indexing of the magazines.

The construction of details of the component transfer mechanism 15 will be given at this time. In its major elements (FIG. 1), the transfer mechanism includes a pair of component retainer heads 62 and 63, held in a fixed, spaced apart relation and reciprocated from a load to unload position by a swivel arm 64, powered by a drive means to be described. Since the retainer heads 62 and 63 are identical, only one (62) will be described at this time.

Figure 8:
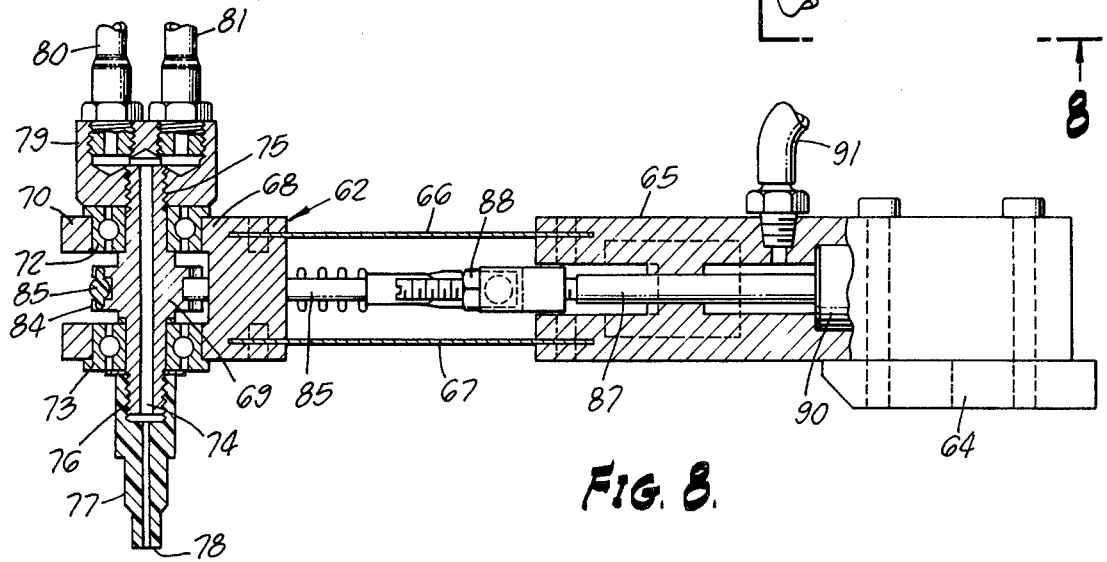
FIG. 8 is a side elevational, sectional, view of the loading mechanism, taken along the line 8—8 of FIG. 7.

The retainer head as depicted in elevation in FIG. 8 is seen to include a bifurcated base 65 with a pair of flat spring arms 66 and 67 secured to each of the base arms extending outwardly therefrom in a spaced parallel relation. The outer ends of the spring arms are affixed in the block 68.

An elongated pneumatic fitting 69 is rotatably journaled in openings within the block 70 by bearing races 72 and 73. More particularly, the fitting 69 includes a passageway 74 extending completely therethrough and has outwardly extending threaded portions 75 and 76. A hollow, tubular member 77, preferably constructed of plastic, is threaded onto the portion 76 of the fitting 69, providing a lower, relatively flat surface 78 for contacting the components and securing them during transfer by low pressure being established in the passageway 74. A further fitting 79 is received onto 75 and is interconnected via hoses 80 and 81 to a source of low pressure air, i.e., a vacuum pump, for example.

Turning now to FIG. 18, there is shown means for determining when a malfunction has occurred in that a chip has not been picked by a retainer head 62 or 63. Specifically, this means includes a block 82 within hose 80 and having a small orifice therethrough and a differential pressure switch 83 operatively related with hose 81. With a component chip 17 in place (dashed line depiction), the pressure throughout the hoses is substantially the same and the switch 83 will reside in its open condition. However, if a chip is for some reason not retained within the vacuum produced, the inrushing air will produce a differential pressure, causing the switch to close and either stop the entire operation, energize a warning light or otherwise indicate the chip absence.

Figure 7:
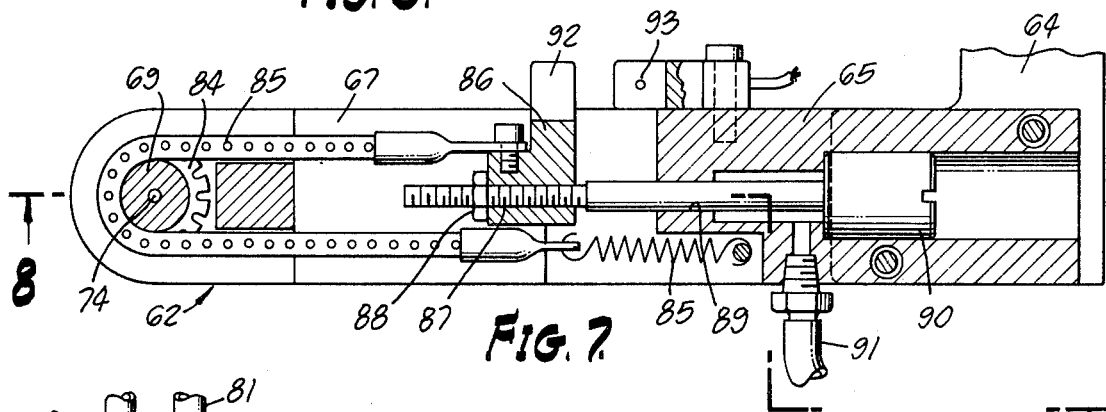
FIG. 7 is a plan, sectional view of the loading mechanism taken along the line 7—7 of FIG. 4.

From the plan view of FIG. 7, it is seen that the fitting 69 includes a gear wheel 84. A drive chain 85 encompasses the gear wheel 84 and has one end interconnected to the base 65 via a coil spring 85. The other end of the chain is secured to an adjusting block 86 which is retained on the end of a drive rod 87 by nut 88. The drive rod 87 passes slidingly through an opening 89 in the base 65 and terminates in a position 90. Pressurized air added via the hose and coupling 91 will cause the piston 90, rod 87, block 86 and the chain 85 to move to the right as it is depicted in FIG. 7. This movement will produce a rotation of the fitting 69 a predetermined angular extent for a purpose that will be more clearly described later.

Rotation verification is accomplished by a portion 92 of the block 86 passing within effective range of a sensor 93 mounted on bifurcated block 65. The sensor may be magnetic, photoelectric or any of several other suitable types of presence sensing devices. On the air pressure being released via 91, the spring 85 returns the retainer head to its starting position.

Figure 4:
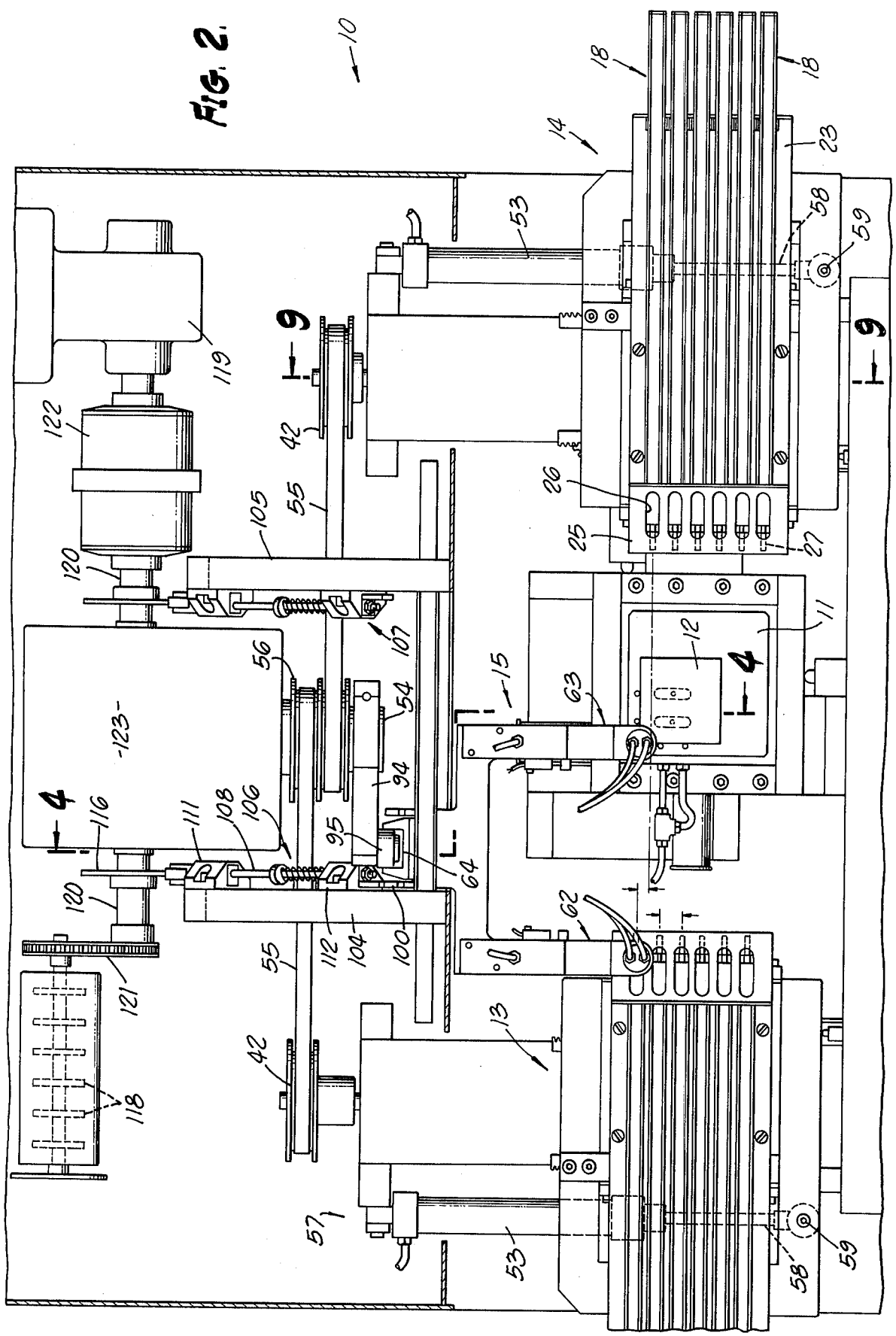
FIG. 4 is a side elevational view taken in section along the line 4—4 of FIG. 2.
Figure 5:
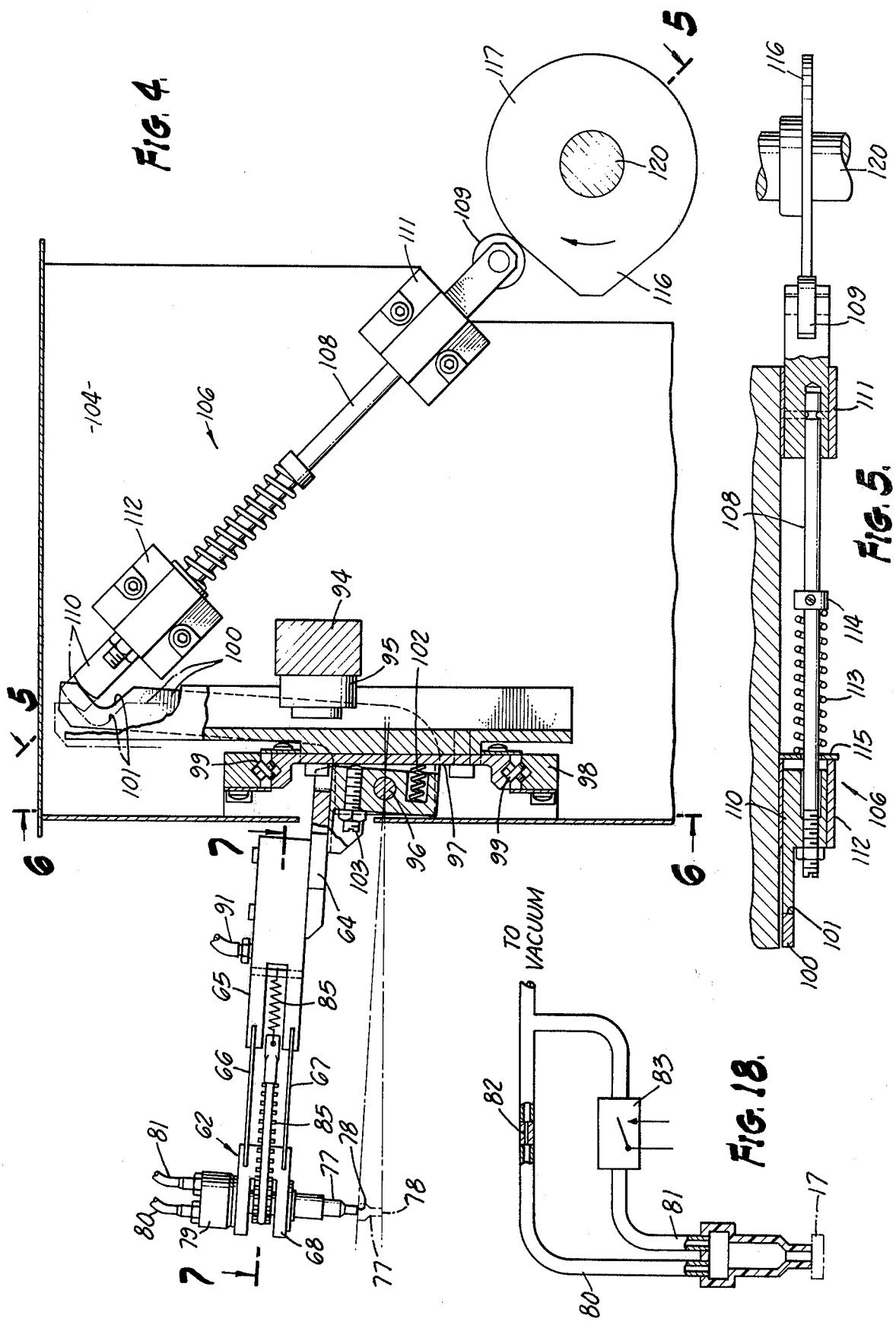
FIG. 5 is a sectional, partially fragmentary, view taken along the line 5—5 of FIG. 4.
Figure 6:
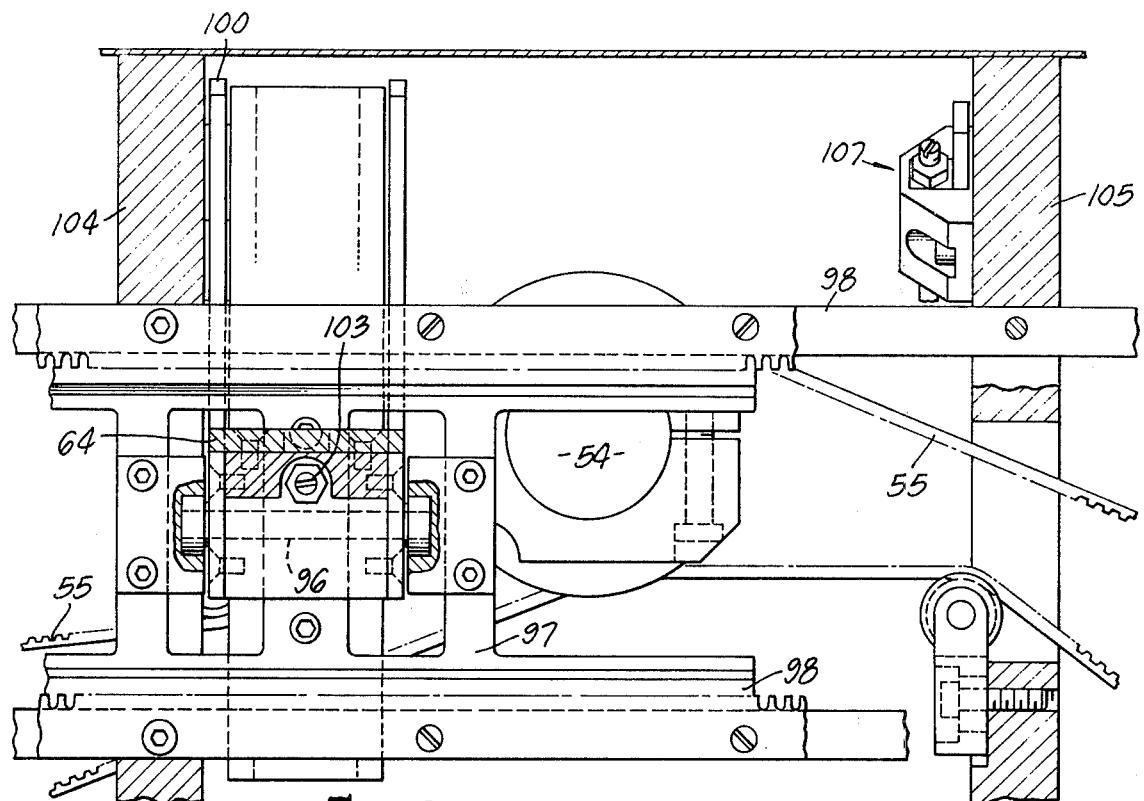
FIG. 6 is a front elevational view in section, taken along the line 6—6 of FIG. 4.

The transfer mechanism 15 has two operational modes of movement, (1) a side-to-side movement in which at one extreme the component retainer head 62 is located over an endmost component in one of the sticks 18 of the magazine 13, and at its other extreme the retainer head 63 is located over an endmost component of one of the sticks in magazine 14, and, (2) a vertical movement in which the retainer heads 62 and 63 are moved as a unit downwardly to contact the endmost component in one of the sticks 18 and for placing a component onto the substrate 12 (FIG. 4). Since the retainer heads 62 and 63 are fixedly located with respect to each other by the swivel arm 64, the side-to-side motion brings the flat tip 78 of each of the retainer heads at one of the two position extremes into registry above the endmost component in a selected stick, as is best shown in FIG. 16, while at the same time the other tip 78 is located a fixed lateral distance from the first retainer head over the substrate 12. As will be shown later herein, the location of the retainer head tip 78 with respect to the substrate 12, is precisely registered by shifting the table on which the substrate resides appropriately in the $x$ and $y$ directions. That is, the retainer heads move laterally to the same point in space each time the exact registry is achieved by positioning the substrate.

The reciprocating side-to-side retainer head motion is provided by the lever arm 94 (FIG. 2), affixed to the shaft 54 and which includes at its outermost extremity a rotatable wheel or bearing 95 received in a vertically extending slot on the back of the swivel arm 64. On rotation of the shaft 54, the lever arm 94 moves the two retainer heads 62 and 63 laterally and at the two extremes provides a period of dwell which, as will be shown, is utilized to both pick up a new component from a stick 18 and, at the same time, to locate a component onto the substrate. As can be seen best in FIG. 4, the swivel plate 64 is L-shaped in side elevation and rotatably mounted via a pin or axle 96 to a generally vertical mounting plate 97. The plate 97 is slidingly arranged relative to a fixed base 98 by roller bearings 99. The generally L-shaped swivel arm 64 also includes an outwardly and upwardly extending actuating arm 100 which passes through a suitable opening in the plate 97 and terminates at its upper back surface in a notch 101. A compression coil spring 102 has one end received in an appropriately shaped well in the back side of the swivel arm 64 at one side of the axle 96 and its other end bears against plate 97. An adjusting screw 103 is located at the opposite side of the axle.

For the ensuing description of the apparatus for producing the vertical or loading and unloading motion of the retainer heads 62 and 63, reference is made to both FIGS. 2 and 4. Just beyond the extreme limits of lateral motion provided by the swivel arm 64, there are upstanding walls 104 and 105. On the facing surfaces of these walls linkages 106 and 107 are located, and since the linkages are identical in construction, only the linkage 106 will be described. This linkage includes a drive rod 108, terminating at one end in a roller 109 and at its opposite end threadedly received into a generally L-shaped pusher member 110, with a curved terminus. Bracket 111 secures the rod 108 to the wall 104 at a point just inwardly of the roller 109 for sliding motion therethrough. A further bracket 112 similarly secures the other end of the rod 108 and the pusher member 110 for sliding movement with respect to itself and the wall 104. A coil spring 113 received on the intermediate portion of the rod 108 between the brackets 111 and 112 provides a resilient retention of the rod by virtue of the securement of its ends between the stop 114 and washer 115 bearing against bracket 112. More particularly, the rod 108 will normally be maintained in its lowermost position as shown in FIG. 4, however, when the high point 116 on the rotating cam 117 engages the roller 109, it moves the rod upwardly as seen in FIG. 4, to the dashed line position. This upward motion causes the curved terminus of the member 110 to engage the actuating arm 100 in the notch 101 and move it to a substantially vertical position which causes the outer end of the retainer head 62 to move to the horizontal dashed line position. The amount of such downward vertical motion is such as to bring the tip 78 into contact with the uppermost surface of a component held in a stick 18, or, when the retainer head is located over the substrate, to move the component being carried thereby into contact with the substrate upper surface. When the high point 116 of the cam passes by the roller 109, the compression spring 113 moves the member 110 again to its lower position, thereby raising the retainer head 62 as a result of the reaction of the spring 102. Adjustment of the uppermost position of the retainer head 62 is obtained by suitably positioning the screw 103, whereas adjustment of the lowermost position can be obtained by threading the member 110 further on or off the end of the rod 108.

The overall timing of the various operations described (e.g., rotation of retainer heads, indexing) is under control of a set of cams 118 (FIG. 2) driven by electric motor 119 via shaft 120 and the pulley and chain linkage 121.

Further as to operation of the described system, the motor 119 through a clutch 122 and shaft 120, provides driving power to indexing mechanism 123 which has the characteristic of producing 180 degrees output rotation of shaft 54 for each 300 degrees of rotation of input shaft 120. During the remaining 60 degrees of rotation of shaft 120, shaft 54 is stationary. In this manner, the unloading and loading movement of the retainer heads 62 and 63 (i.e., vertical) is accomplished only during the 60 degree dwell period when no indexing is taking place. Also, as has already been mentioned, the pitch of the worm screw 41 is such that one revolution indexes the sticks 18 a distance D so as to line up the sticks exactly with the retainer heads 62 and 63 each time they reach their limits of motion.

Although the detailed control apparatus is not shown, means are provided for cycling through a series of component placements (e.g., component A to locations $x1y1$ and $x2y2$, component B to locations $x3y3$, etc.) on a substrate, return the trays to the starting position for component placement on a new substrate. It is also within the spirit of the invention to provide a plurality of substrates and load components on each substrate in one pass such that on completion of one loading cycle, a plurality of identical circuit apparatus are obtained instead of one as in the first described version.

For example, and with reference again to FIG. 1, the control apparatus 16 includes two columns of paired thumbwheel input devices, one for magazine 13 ("L") and one for magazine 14 ("R"). Each pair of thumbwheel devices corresponds to a stick in the magazine and are adjustable to precisely locate components obtained from that stick in the desired "X" and "Y" position. Switches are provided for each set of paired thumbwheel devices, allowing them to be selectively excluded and included in the cycle as desired.

We claim:

1. Apparatus for locating components of different kinds on a substrate surface, comprising:
   first and second magazines arranged in mutually spaced relation;
   a plurality of elongated trays arranged in two sets on said first and second magazines in side-by-side relation, each tray including a plurality of components in end-to-end arrangement along the tray length;
   a table carrying the substrate situated between said first and second magazines;
   a pair of vacuum retainers mounted in fixed spaced relation on a plate;

means for moving said plate and vacuum retainers along a first path from a first extreme with one of said vacuum retainers disposed spaced above the first magazine and the other retainer spaced above the substrate to a second extreme with the other retainer spaced above the second magazine and the first recited retainer spaced above the substrate, and along a second path toward and then away from the substrate and magazines each time the plate and vacuum retainers are located at the first and second extremes of the first path; and means for establishing a vacuum in the retainers to secure components thereto and for breaking the vacuum in each retainer at the conclusion of its movement toward the substrate.

2. Apparatus as in claim 1, in which each tray includes an elongated member having a longitudinally extending slot in an outer surface thereof for receiving a plurality of similarly dimensioned components in end-to-end relation, and a cover received over the components preventing all but the endmost component from being withdrawn from the tray.

3. Apparatus as in claim 1, in which each tray is supported on the magazine with an endmost component being lower than the others, whereby gravity urges the components toward said tray endmost position.

4. Apparatus as in claim 3, in which there is further provided means carried by said magazines for vibrating said trays to aid gravity urging of the components.

5. Apparatus as in claim 1, in which there is further provided means for moving the magazines transversely of the tray long dimension cyclically advancing each of the trays into operative relation with the vacuum retainers.

6. Apparatus as in claim 1, in which there is provided means for adjustably locating said substrate to any desired predetermined $x$ and $y$ position with respect to said retainers first and second extremes.

7. Apparatus as in claim 6, in which each of said trays includes different components and there are further provided means selectively adjustable for sequentially locating the components of the different trays at predetermined locations.

8. Apparatus as in claim 1, in which each vacuum retainer includes at least one hollow tube interconnected with a low air pressure source, a differential pressure electric switch operatively connected with said hollow tube, and indicating means actuated by said switch on a differential air pressure existing in said tube.

9. In a process of locating components on a substrate where a vacuum retainer is cyclically moved toward a component, securing contact between the retainer and the components is established, and the so-secured component is moved to the substrate and the retainer disengages the component, leaving it resting on the substrate, comprising the steps of:

arranging the components in an end-to-end line in a holder having open ends facing the ends of the line of components, said components being freely slidable in a direction along the components line toward either of the holder open ends and restrained from movement in all other directions;

continuously forcing the line of components toward one of the holder open ends such that an endmost component tends to move toward the holder open end;

moving the holder to align the endmost component with the retainer;

securingly engaging said endmost components with the retainer; and removing said endmost component from the retainer securingly engaged with said endmost component whereby the next adjacent component in the line of components is forced into the endmost position.

* * * * *